(12) United States Patent  
Seki

(10) Patent No.: US 6,985,824 B2  
(45) Date of Patent: Jan. 10, 2006

(54) FREQUENCY MEASURING DEVICE

(75) Inventor: Kempei Seki, Tokyo (JP)

(73) Assignee: TMT & D Corporation, Tokyo (JP)

( * ) Notice: Subject to any disclaimer, the term of this patent is extended or adjusted under 35 U.S.C. 154(b) by 106 days.

(21) Appl. No.: 10/782,960

(22) Filed: Feb. 23, 2004

(65) Prior Publication Data

US 2004/0243329 A1    Dec. 2, 2004

(30) Foreign Application Priority Data

Jun. 2, 2003    (JP) ............................. 2003-156911

(51) Int. Cl.  
*G01R 23/00*    (2006.01)

(52) U.S. Cl. .................... 702/75; 702/125; 324/76.21; 324/76.55; 324/76.74; 361/78

(58) Field of Classification Search ............ 702/75–77, 702/125–126, 78; 324/650, 76.21, 76.55, 324/76.74; 361/78  
See application file for complete search history.

(56) References Cited

U.S. PATENT DOCUMENTS 4,135,243 A * 1/1979 Peregrino et al. ............. 702/78
4,319,329 A * 3/1982 Girgis et al. .................. 702/75
4,715,000 A * 12/1987 Premerlani .................. 702/126

FOREIGN PATENT DOCUMENTS

JP             9-166630        6/1997

* cited by examiner

*Primary Examiner*—John Barlow  
*Assistant Examiner*—Hien Vo  
(74) *Attorney, Agent, or Firm*—Leydig, Voit & Mayer, Ltd.

(57) ABSTRACT

A frequency measuring device can measure the frequency of a noisy power system at high speed. The system voltage is measured at timings obtained by equally dividing one reference-wave period. Voltage vectors are calculated which have tip ends, each voltage vector consisting of a real part of a first measured voltage and an imaginary part of another voltage measured at timing 90 degrees before the first measured voltage. The length of a chord connecting tip ends of adjacent voltage vectors is calculated. A voltage root-mean-square value is calculated from voltages measured between two timings spaced from each other by the one reference-wave period. Chord lengths obtained between two timings spaced from each other by the one reference-wave period are summed. Based on the total of the chord lengths and the voltage root-mean-square value, there is calculated a phase angle between two adjacent voltage vectors, from which the system frequency is calculated.

4 Claims, 20 Drawing Sheets

RESULT OF MEASUREMENTS OF VOLTAGE WAVEFORM AT 55 Hz
(REFERENCE WAVE FREQUENCY OF 50 Hz)

RESULT OF MEASUREMENTS OF VOLTAGE WAVEFORM AT 65 Hz
(REFERENCE WAVE FREQUENCY OF 60 Hz)

FIG. 16

| REFERENCE WAVE ROTATIONAL ELECTRICAL ANGLE (DEGREES) | STEP SIZE Δt (SECONDS) | NUMBER OF CORDS WITHIN REFERENCE WAVE ONE PERIOD |
|---|---|---|
| 30 | 0.00167 | 12 |
| 15 | 0.00133 | 24 |
| 7.5 | 0.00042 | 48 |
| 3.75 | 0.00021 | 96 |

FIG. 17

| REFERENCE WAVE ROTATIONAL ELECTRICAL ANGLE (DEGREES) | STEP SIZE Δt (SECONDS) | NUMBER OF CORDS WITHIN REFERENCE WAVE ONE PERIOD |
|---|---|---|
| 30 | 0.00139 | 12 |
| 15 | 0.00069 | 24 |
| 7.5 | 0.00035 | 48 |
| 3.75 | 0.00017 | 96 |

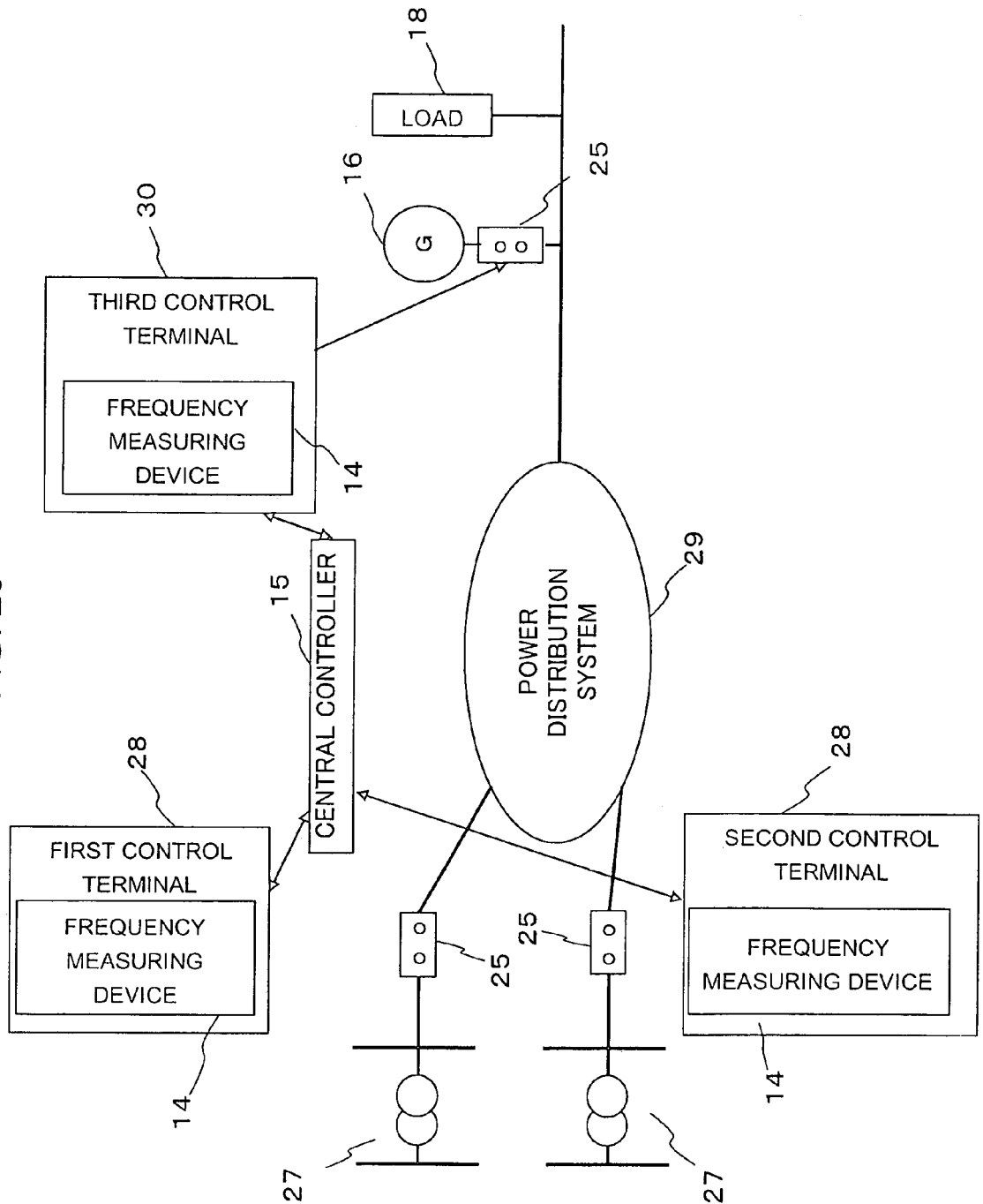

FREQUENCY MEASURING DEVICE

BACKGROUND OF THE INVENTION

1. Field of the Invention

The present invention relates to a frequency measuring device for measuring the frequency of an electric power system.

2. Description of the Related Art

A known frequency measuring device includes a means for sampling an input signal at a predetermined cycle or period to convert it into digital data thereby to obtain a data row, a means for obtaining, from the data row, the timing of each zero crossing point based on pieces of data at a plurality of points before and after each zero crossing point, and a means for obtaining the fundamental wave frequency of an input signal by detecting, as one cycle or period thereof, the time between two adjacent zero crossing points at which the input signal crosses a zero level in the same direction (for instance, see a patent document: Japanese patent application laid-open No. H09-166630).

However, the conventional frequency measuring device as referred to above determines zero crossing timings of the input signal through linear interpolation from a plurality of pieces of data in a sampling cycle or period, so it takes time to perform convergent calculations for linear interpolation, and hence the measurements of the zero cross timings need a relatively long time.

In addition, after a zero crossing point has been detected, the detection of further zero crossing points at a midpoint and its neighborhood of one period at a frequency that has been set in advance as an estimated frequency, i.e., an estimated fundamental wave frequency of an input signal is nullified. As a result, when there are comparatively many harmonic components or noise components, the detection or measurement of zero crossing points would be influenced by such harmonic components or noise components.

SUMMARY OF THE INVENTION

Accordingly, the object of the present invention is to provide a frequency measuring device capable of measuring the frequency of an electric power system at high speed even if the electric power system has much noise or like.

Bearing the above object in mind, the present invention resides in a frequency measuring apparatus which is constructed as follows. That is, a voltage measuring part measures the voltage of an electric power system at timings which are obtained by equally dividing one period of a reference wave by 4N (N being a positive integer). A chord length calculation part calculates, at each of the (4N+1) timings, voltage vectors directed to points represented by complex numbers on a complex plane each consisting of a real part which is one of the voltages measured at a first timing comprising any of the (4N+1) timings, and an imaginary part which is a voltage measured at a second timing delayed by 90 electrical degrees from the first timing. The chord length calculation part further calculates, at each of the (4N+1) timings, the length of a cord connecting between a tip end of one of the voltage vectors calculated at a third timing comprising any of the (4N+1) timings and a tip end of another of the voltage vectors calculated at the last timing before the third timing. A voltage root-mean-square value calculation part calculates, at a fourth timing comprising each of the (4N+1) timings, a voltage root-mean-square value from those of the voltages which are measured at past 4N timings from the fourth timing and at the fourth timing.

A rotational phase angle calculation part sums, at a fifth timing comprising each of the (4N+1) timings, those of the cord lengths which have been obtained at past 4N timings from the fifth timing and at the fifth timing, and calculates, based on a total sum of the cord lengths and the voltage root-mean-square value, a phase angle between one of the voltage vectors calculated at a sixth timing comprising any of the timings and another voltage vector calculated at a timing preceding the sixth timing by one period of the reference wave. A frequency calculation part calculates the frequency of the electric power system from the phase angle thus calculated.

With this arrangement, the frequency can be measured at high speed with high accuracy.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 16 shows the values of a step size when the sampling period of a reference wave having a frequency of 50 Hz has been changed.

FIG. 17 shows the values of a step size when the sampling period of a reference wave having a frequency 60 Hz has been changed.

FIG. 20 is a block diagram of a power distribution system dispersed power source individual operation preventive apparatus using a frequency measuring device according to a fourth embodiment of the present invention.

DESCRIPTION OF THE PREFERRED EMBODIMENTS

Hereinafter, preferred embodiments of the present invention will be described in detail while referring to accompanying drawings.

Embodiment 1.

Figure 1:
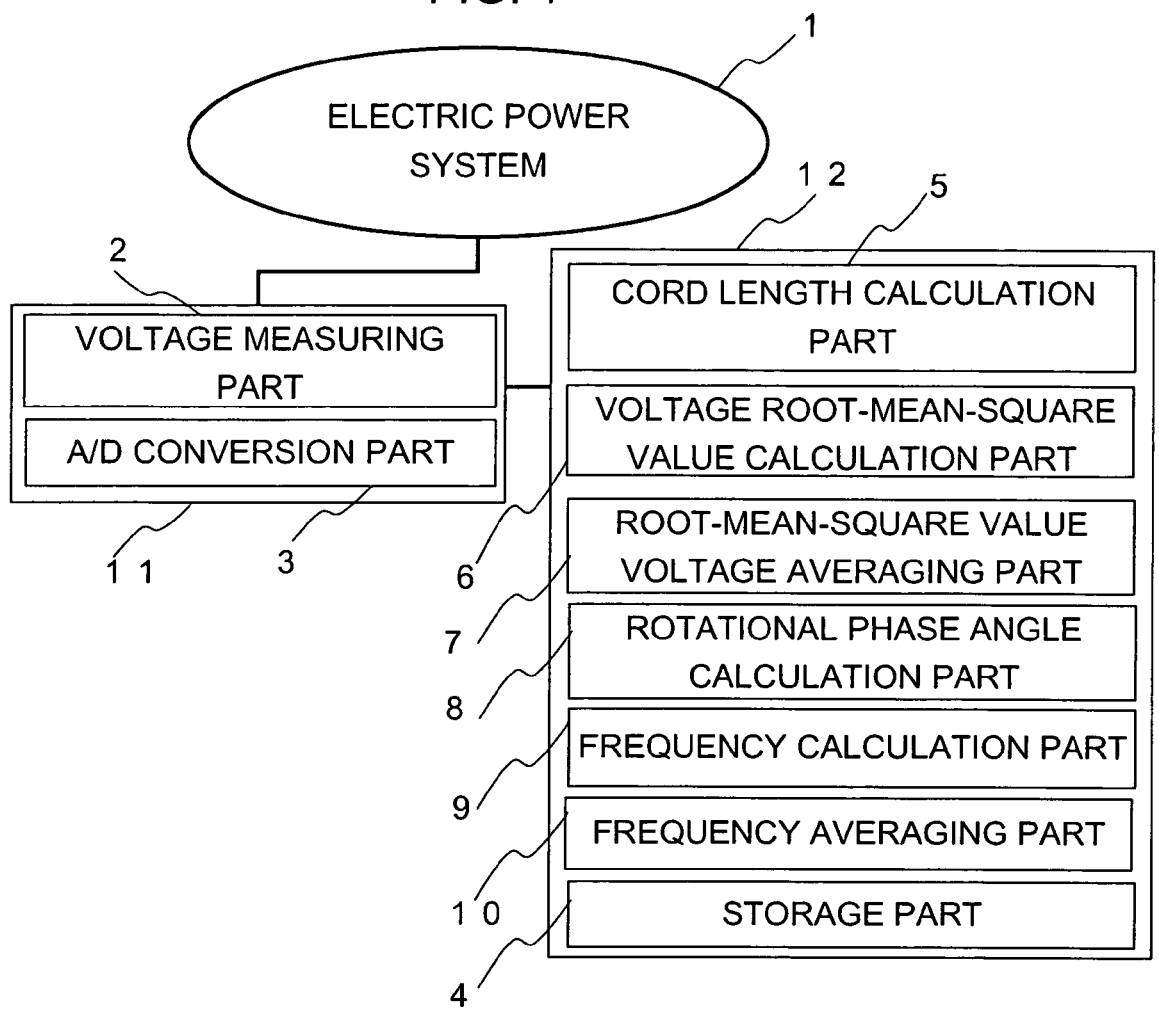
FIG. 1 is a block diagram of a frequency measuring device according to a first embodiment of the present invention.
Figure 2:
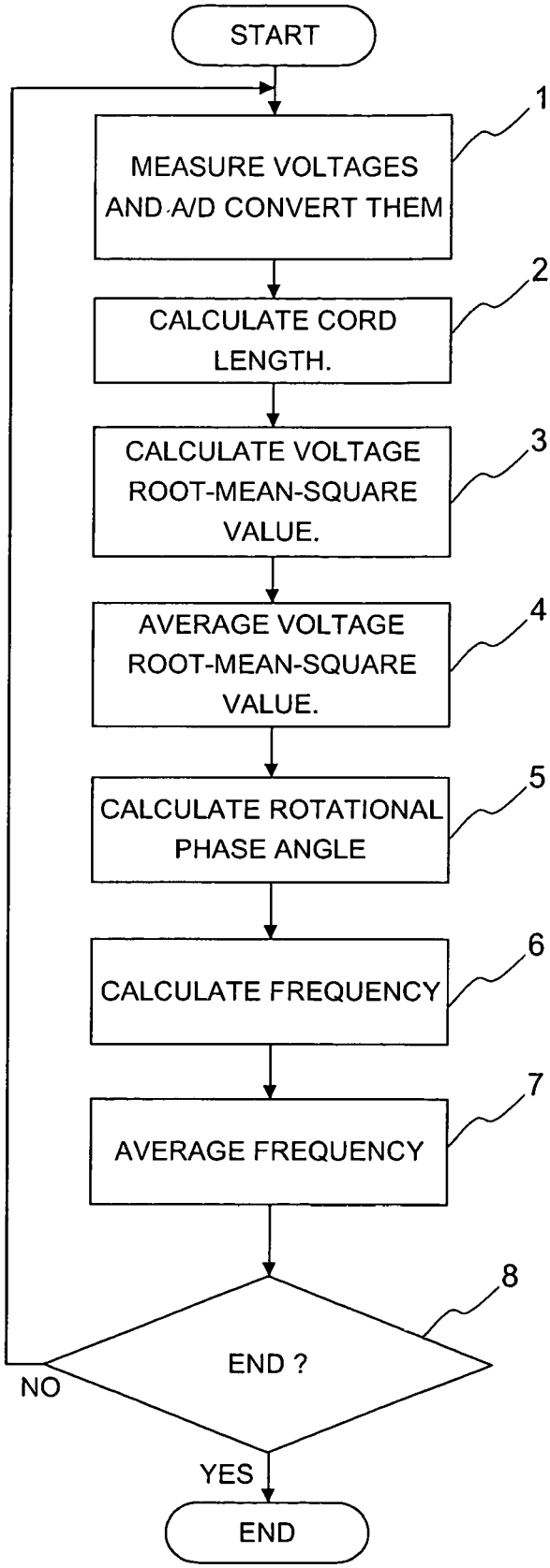
FIG. 2 is a flow chart of a frequency measurement procedure used in the frequency measuring device of FIG. 1.

FIG. 1 is a block diagram of a frequency measuring device according to a first embodiment of the present invention. FIG. 2 is a flow chart of the frequency measurement carried out by the frequency measuring device of FIG. 1.

The frequency measuring device includes a voltage measuring part 2 for measuring the voltage of an electric power system 1, an A/D conversion part 3 for converting the measured analog voltage input thereto into digital voltage data, a storage part 4 for storing the digital voltage data, a chord length calculation part 5 for calculating the length of a cord formed between tip ends of adjacent rotating voltage vectors upon each sampling, a voltage root-mean-square value calculation part 6 for calculating a voltage root-mean-square value from each voltage vector, a root-mean-square value voltage averaging part 7 for averaging the calculated voltage root-mean-square values in a prescribed period, a rotational phase angle calculation part 8 for integrating the calculated cord length in a prescribed period of time to calculate a rotational phase angle, a frequency calculation part 9 for calculating the frequency of the electric power system 1 from the calculated rotational phase angle, and a frequency averaging part 10 for averaging the calculated frequency of the electric power system for a prescribed period.

The voltage measuring part 2 and the A/D conversion part 3 are constituted by a voltmeter 11 having a digital voltage output terminal. In addition, the storage part 4, the chord length calculation part 5, the voltage root-mean-square value calculation part 6, the root-mean-square value voltage averaging part 7, the rotational phase angle calculation part 8, the frequency calculation part 9 and the frequency averaging part 10 are constituted by a computer 12. The computer 12 includes a CPU, a RAM, a ROM and an interface circuit.

Although in the following description, the frequency $f_0$ (Hz) of the reference wave being 50 Hz or 60 Hz is taken as an example, the reference wave is not limited to such frequencies. One period of the reference wave $T_0$(second) is a reciprocal $1/f_0$ of the frequency $f_0$ thereof.($T_0=1/f_0$)

In addition, timings at which the voltage of the electric power system 1 is measured are decided by determining the sampling cycle or period. The sampling period can be any value by which one period of the reference wave can be equally divided into 4N (N being a positive integer). As will be described later, since a voltage at a time point delayed by 90 electrical degrees from each sampling timing is used as the coordinate of the tip end of a voltage vector, a time point delayed by 90 degrees from each sampling timing should be one of the sampling timings. The one period of the reference wave is represented as $2\pi$ (radian) in terms of the electrical angle. For instance, an electrical angle of such as, for example, $\pi/6$, $\pi/12$, $\pi/24$, or $\pi/48$ of the reference wave is beforehand set as the sampling period.

Next, reference will be made to the procedure of measuring the frequency of the power system 1 while referring to FIG. 2. In this explanation, it is assumed that the frequency $f_0$ of the reference wave is 50 Hz, the sampling period is $\pi/6$ of the reference wave, and the step size $\Delta t$ (second) is 0.00166667 seconds. Also, k represents the order of the sampling timings, and the voltage measurement timing is rotated by a reference wave electrical angle of 30 degrees between timings k=1 and k=2.

Figure 3:
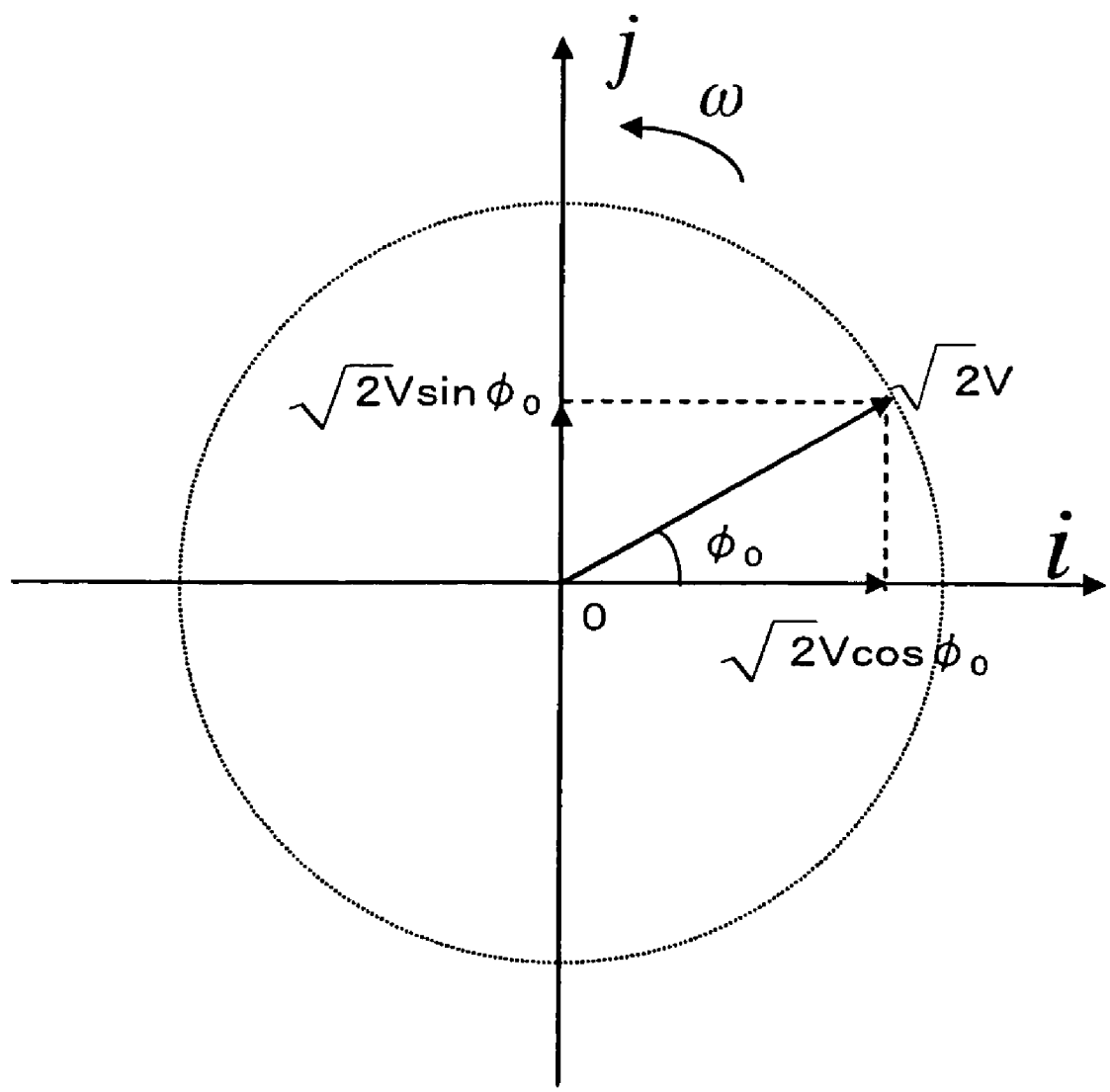
FIG. 3 is a view of a voltage vector shown on the complex plane.

In step 1, the voltage measuring part 2 measures the voltage of the electric power system 1 to be measured upon each sampling timing. The timing at this time (i.e., the present timing) is represented by k. The last timing at which a measurement was made at the last time is represented by (k−1), and the timing following the present timing is represented by (k+1). Thereafter, the A/D conversion part 3 converts the measured voltage in the form of an analog signal into a digital voltage signal, which is then stored in the storage part 4. When an instantaneous voltage value v of the electric power system is expressed by a voltage vector rotating in a counterclockwise direction around the origin 0 on the complex plane, as shown in FIG. 3, this measured voltage is the real part $v_{re}(t)$ of the instantaneous voltage as represented by expression (1) below. Here, note that V represents the voltage root-mean-square value (volts), $\omega$ the angular velocity of the voltage vector (radian/second), and $\phi_0$ the voltage initial rotational phase angle (radian). The angular velocity $\omega$ has a relation of $\omega=2\pi f$ with respect to the frequency f of the electric power system to be measured.

$$v(k) = \sqrt{2}\, V e^{j(\omega t+\phi_0)} \qquad \text{[Expression (1)]}$$
$$= \sqrt{2}\, V e^{j(\frac{\pi}{6}k+\phi_0)}$$
$$= v_{re}(k) + j v_{im}(k)$$

Figure 4:
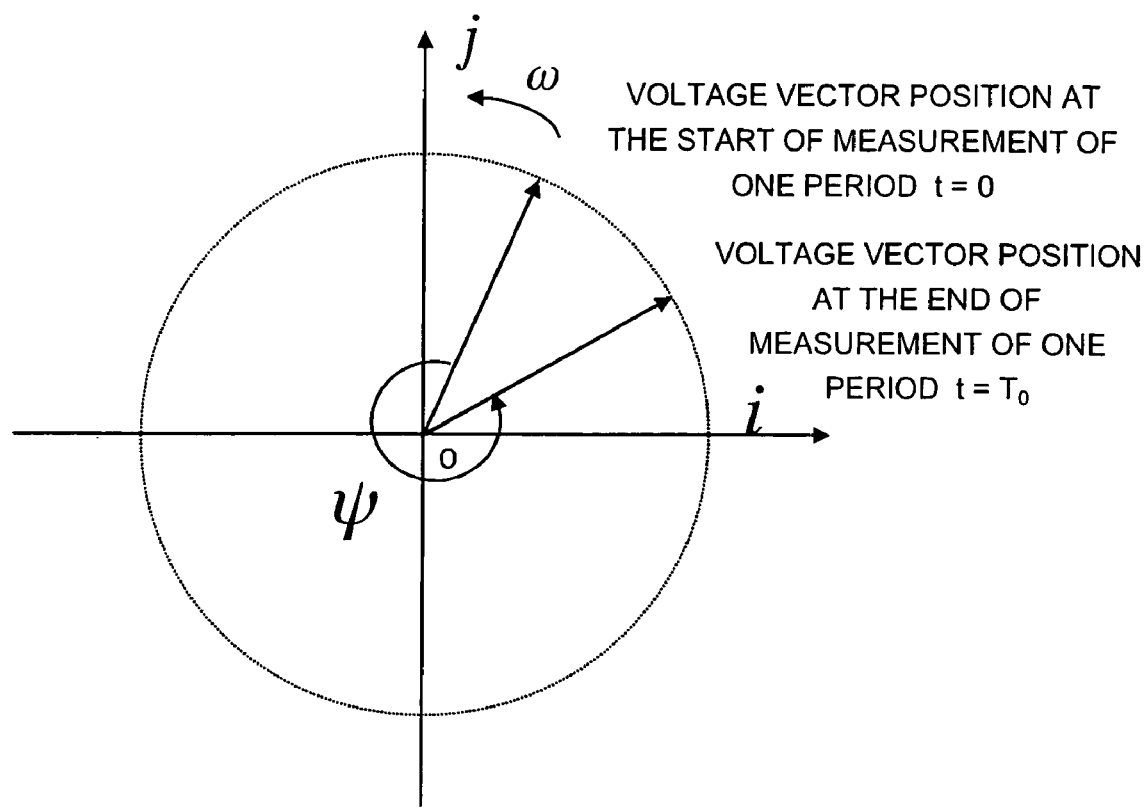
FIG. 4 is a view showing the voltage vector having rotated in one cycle or period of a reference wave in FIG. 3.

In step 2, the chord length calculation part 5 calculates the length of a cord connecting between the tip ends or points of two instantaneous voltage vectors. As shown in FIG. 4, the voltage vector of the electric power system to be measured rotates counterclockwise by a phase angle $\psi$ (radian) on the complex plane in one period of the reference wave, i.e., from a start time point of t=0 to an end time point of $t=T_0$. As shown in expression (2) below, an instantaneous voltage v(k) consists of an instantaneous voltage real part $v_{re}(k)$ and an instantaneous voltage imaginary part $v_{im}(k)$. As shown in expression (3) below, the instantaneous voltage imaginary part $v_{im}(k)$ is equal to $v_{re}(k-3)$. When the sampling period is assumed to be $\pi/6$, the instantaneous voltage imaginary part $v_{im}(k)$ is the voltage measured at the timing of (k−3). However, when the sampling period is assumed to be $\pi/12$ for instance, the instantaneous voltage imaginary part $v_{im}(k)$ corresponds to the voltage measured at the timing of (k−6).

Figure 5:
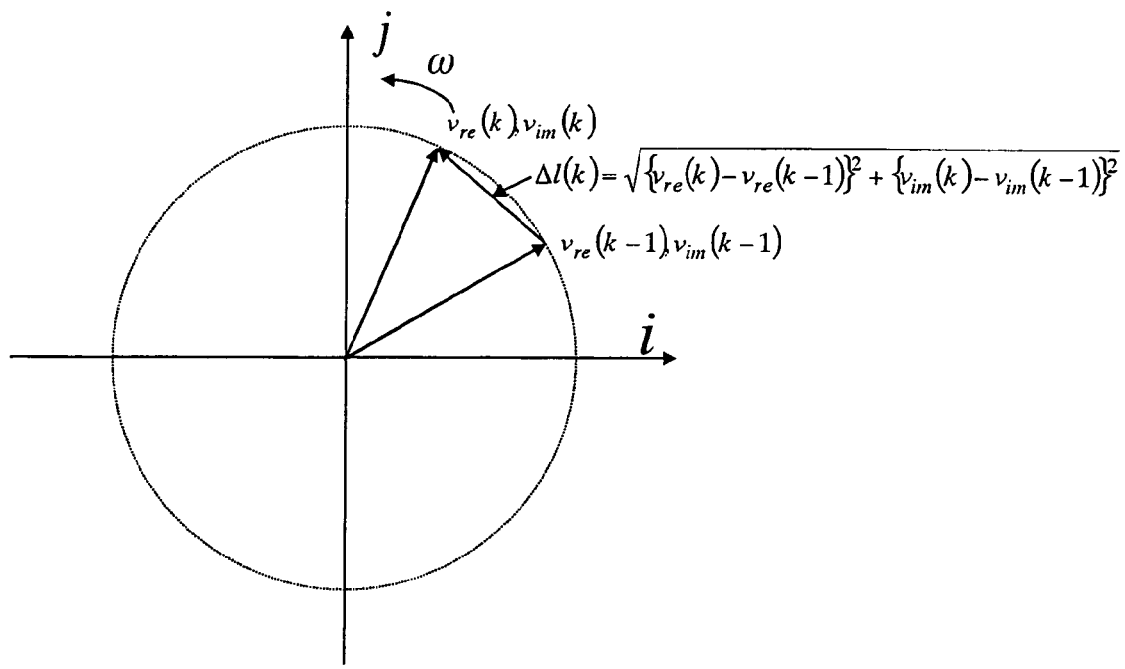
FIG. 5 is a view explaining the calculation of a chord length between two points at tip ends of voltage vectors.

Thus, the coordinate at the tip end or point of the voltage vector can be represented by a complex number consisting of a real part $v_{re}(k)$ and an imaginary part $v_{im}(k)$. The imaginary part $v_{im}(k)$ is obtained by reading a corresponding $v_{re}(k-3)$ from the storage part 4. Since the coordinates of the voltage vectors at timings k and (k−1), respectively, can be obtained in this manner, the length $\Delta l(k)$ of a cord connecting between the tip ends or points of these voltage vectors shown in FIG. 5 can be obtained according to expression (4) below.

$$v_{re}(k) = \sqrt{2}\, V\cos\left(\frac{\pi}{6}k + \phi_0\right) \quad \text{[Expression (2)]}$$

$$v_{im}(k) = \sqrt{2}\, V\sin\left(\frac{\pi}{6}k + \phi_0\right)$$

$$v_{im}(k) = \sqrt{2}\, V\sin\left(\frac{\pi}{6}k + \phi_0\right) \quad \text{[Expression (3)]}$$

$$= \sqrt{2V}\cos\left(\frac{\pi}{6}k + \phi_0 - \frac{\pi}{2}\right)$$

$$= v_{re}(k-3)$$

$$\Delta l(k) = \sqrt{\{v_{re}(k) - v_{re}(k-1)\}^2 + \{v_{im}(k) - v_{im}(k-1)\}^2} \quad \text{[Expression (4)]}$$

Figure 6:
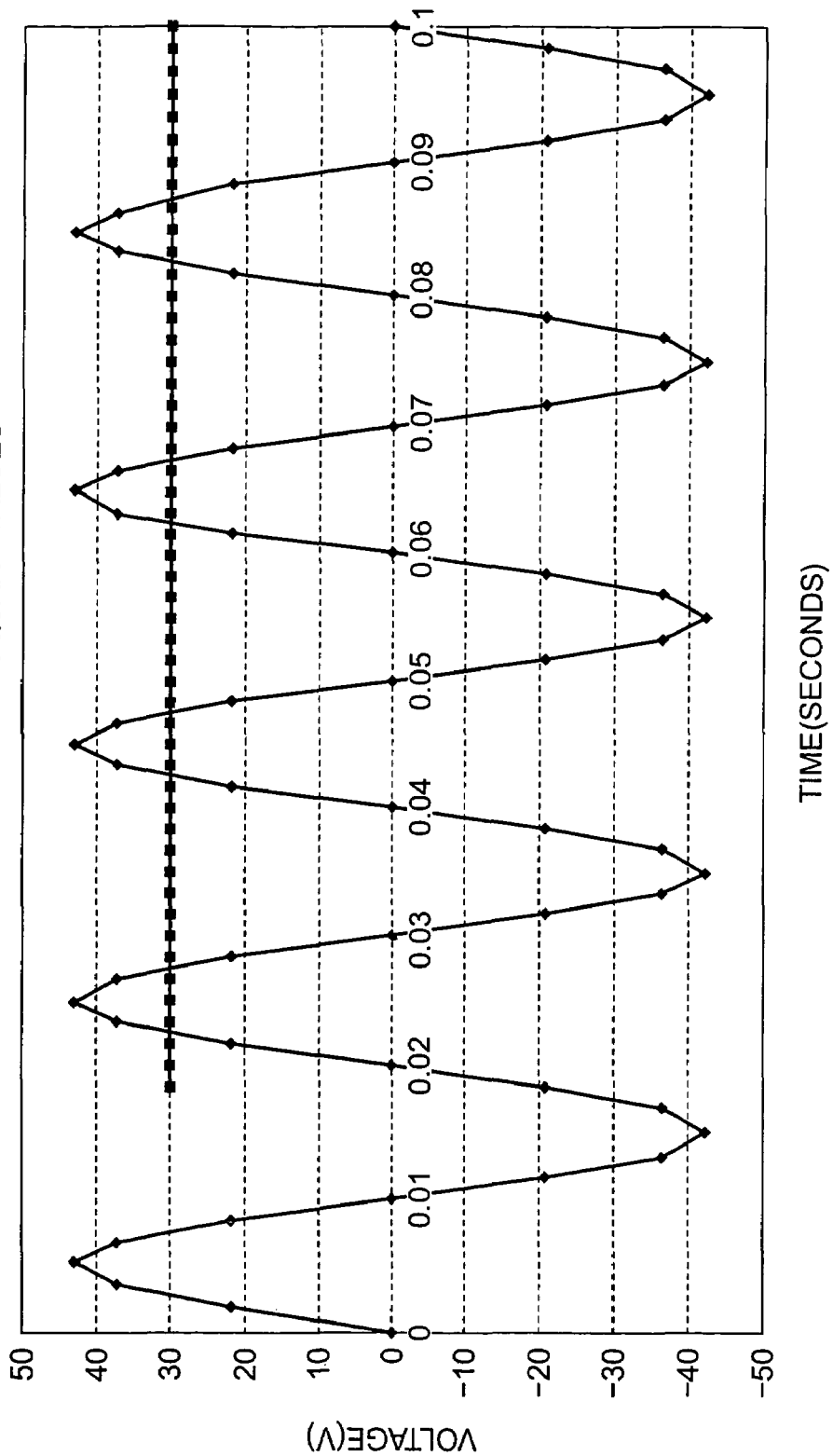
FIG. 6 shows the measurement result of the voltage root-mean-square values of an electric power system having a frequency equal to the frequency of a reference wave measured in FIG. 1.

In step 3, the voltage root-mean-square value calculation part 6 calculates voltage root-mean-square values V within one period of the reference wave based on instantaneous voltage real parts $v_{re}$ by using expression (5) below. FIG. 6 shows the measurement result of the voltage root-mean-square values V. More specifically, FIG. 6 indicates the measurement result when the frequency of the reference wave is substantially the same as the frequency of an object to be measured.

$$V(k) = \sqrt{\frac{1}{12}\sum_{i=1}^{12}\{v_{re}(k-12+i)\}^2} \quad \text{[Expression (5)]}$$

Figure 7:
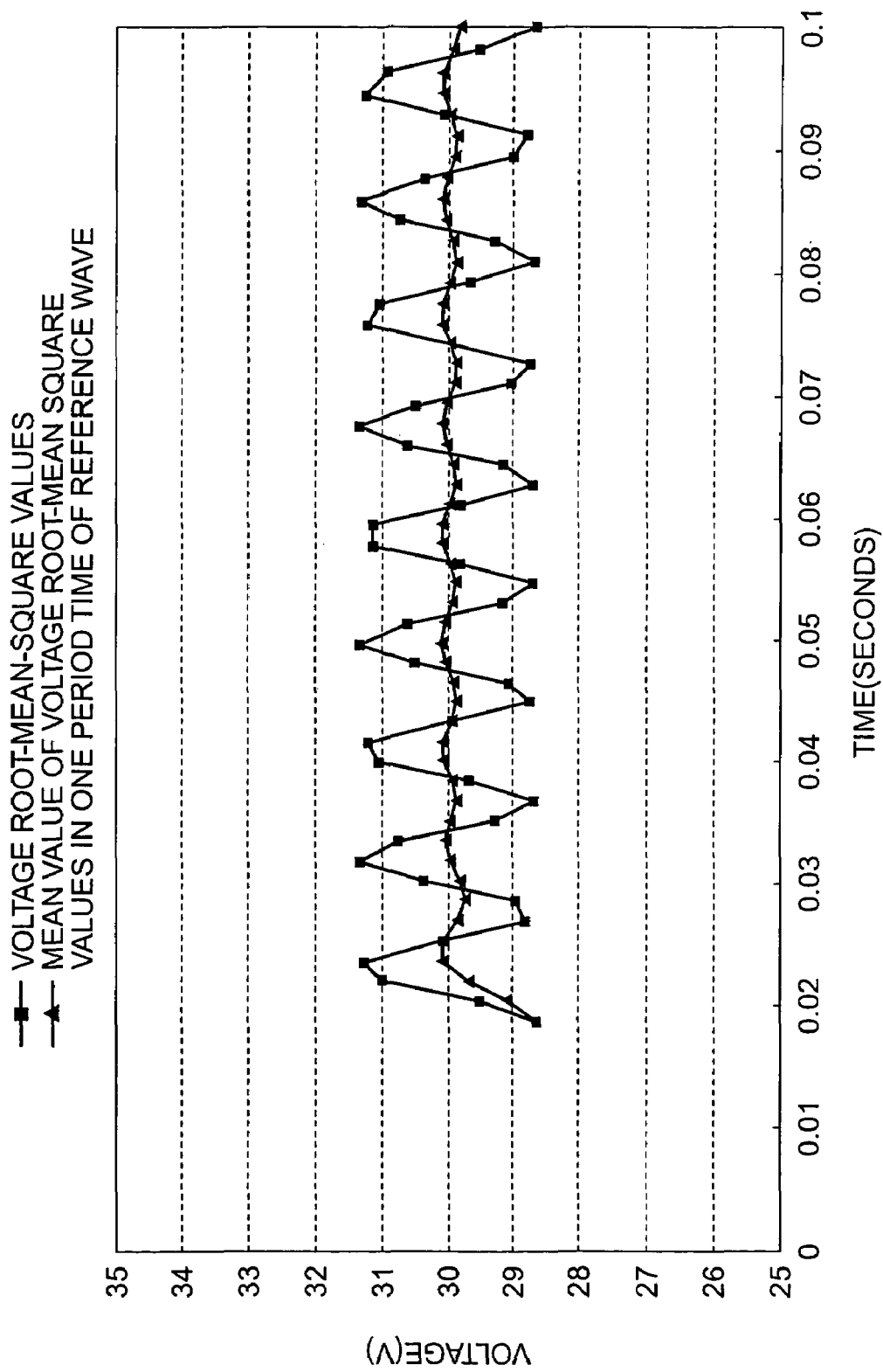
FIG. 7 shows the measurement result of the voltage root-mean-square values and their mean or averaged values of the electric power system having a frequency different from the frequency of the reference wave measured in FIG. 1.

In step 4, the root-mean-square value voltage averaging part 7 calculates the mean value $V_{ave}(k)$ of the voltage root-mean-square values V within one period of the reference wave according to expression (6) below. The mean value $V_{ave}(k)$ of the voltage root-mean-square values at timing k is the mean value of the voltage root-mean-square values which have been obtained from timing (k−11) to timing k, respectively. As shown in FIG. 7, when the frequency of the electric power system to be measured is different from the frequency of the reference wave, the voltage root-mean-square values oscillate around an actual voltage root-mean-square value. To remove the influence of such an oscillation, an averaging process is performed.

$$V_{ave}(k) = \frac{1}{12}\sum_{i=1}^{12} V(k-12+i) \quad \text{[Expression (6)]}$$

The accuracy in the voltage root-mean-square values thus processed improves according to the length of time of the averaging process. However, in order to shorten the measuring time, the averaging process is performed by using the voltage root-mean-square values obtained during the one period of the reference wave, e.g., in twelve samplings in this case.

Figure 8:
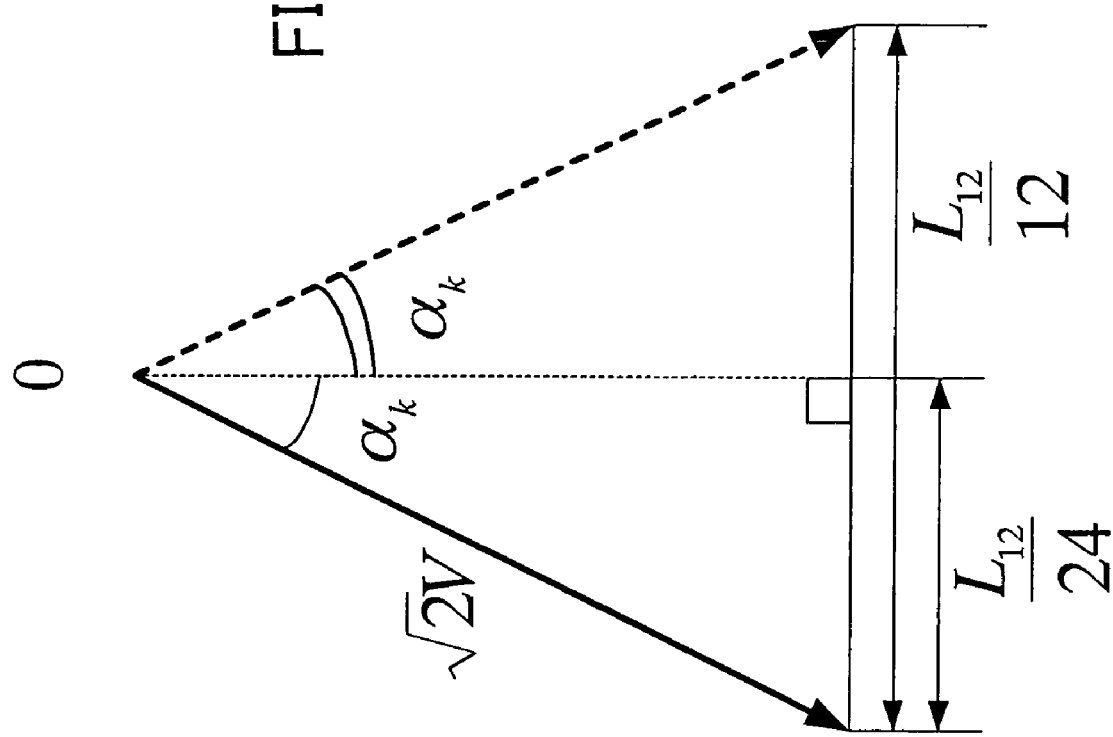
FIG. 8 is a view explaining the calculation of a phase angle facing a chord formed by two tip ends of voltage vectors.

In step 5, the rotational phase angle calculation part 8 calculates a total chord length $L_{12}(k)$ based on the chord lengths calculated at the timings within the one period of the reference wave before timing k by using expression (7) below. Then, the rotational phase angle calculation part 8 calculates a rotational phase angle $2\alpha_k$ between timing k and timing (k+1) according to expression (8) below, as shown in FIG. 8. A phase angle $\psi(k)$ between one voltage vector at timing k and another voltage vector at a timing preceding the timing k by one period of the reference wave is calculated from the rotational phase angle $2\alpha_k$ thus obtained by using expression (9) below. The phase angle $\psi(k)$ is an electrical angle through which the voltage vector has rotated in one period of the reference wave.

$$L_{12}(k) = \sum_{i=1}^{12}\{\Delta l(k-12+i)\} \quad \text{[Expression (7)]}$$

$$= \sum_{i=1}^{12}\sqrt{\{v_{re}(k-12+i) - v_{re}(k-13+i)\}^2 + \{v_{im}(k-12+i) - v_{im}(k-13+i)\}^2}$$

$$\alpha_k = \sin^{-1}\left(\frac{\frac{L_{12}(k)}{24}}{\sqrt{2}\, V_{ave}(k)}\right) \quad \text{[Expression (8)]}$$

$$\psi(k) = 24 \times \alpha_k \quad \text{[Expression (9)]}$$

In step 6, the frequency calculation part 9 calculates the frequency f of the electric power system to be measured from the phase angle of $2\pi$ of one period of the reference wave and the phase angle of $\psi(k)$ of the objected to be measured by using expression (10) below. Here, $f_0$ represents the frequency of the reference wave.

$$f(k) = \frac{f_0}{2\pi} \times \psi(k) \quad \text{[Expression (10)]}$$

Figure 9:
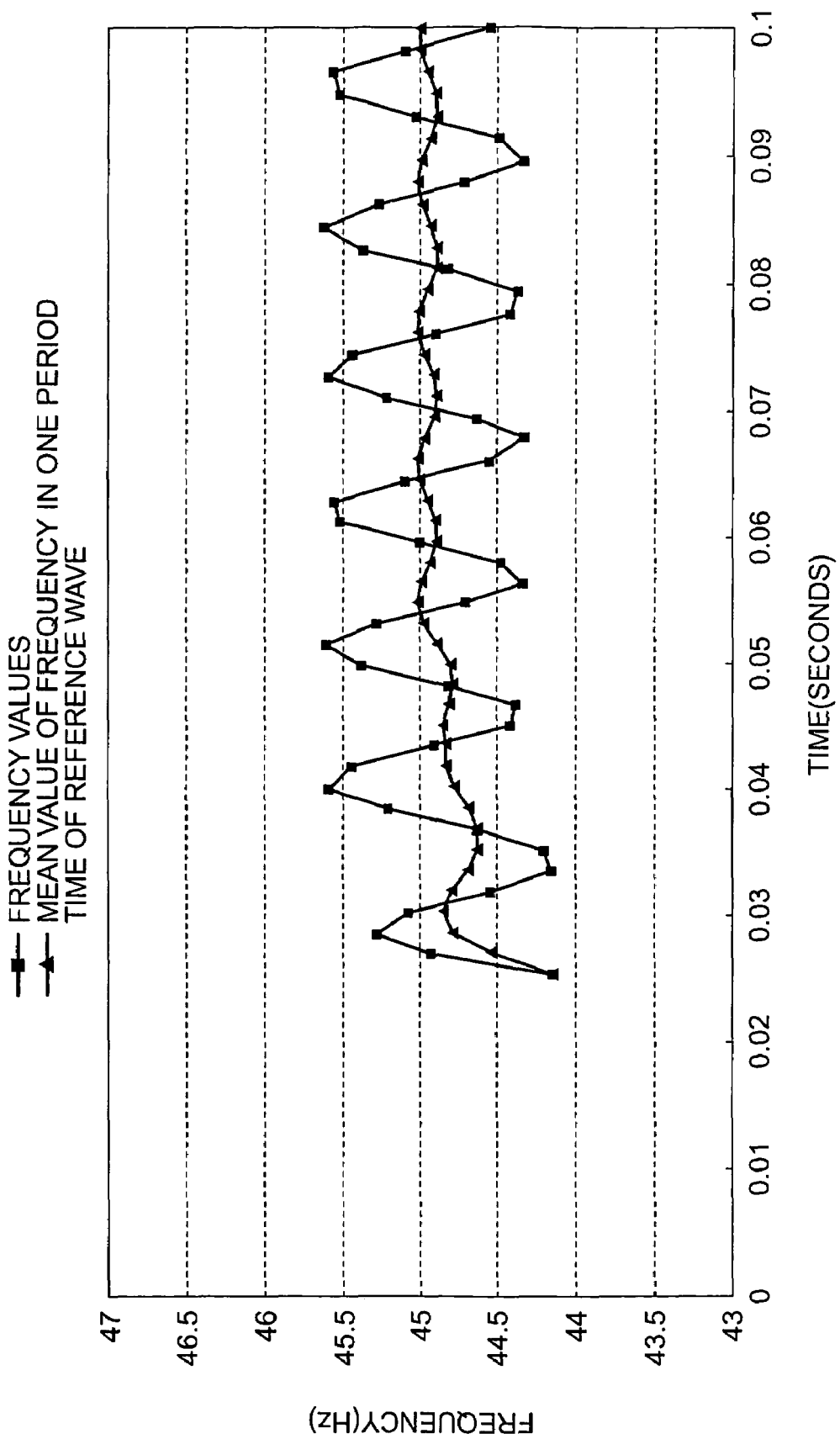
FIG. 9 shows the measurement result of the frequency and its mean or averaged frequency of the electric power system having a frequency different from the frequency of the reference wave measured in FIG. 1.

In step 7, the frequency averaging part 10 calculates the mean value fave of the frequency f during one period of the reference wave by using expression (11) below. When the frequency f (k) of the object to be measured is different from the frequency $f_0$ of the fundamental wave, the frequency f (k) of the object to be measured in the expression (10) above oscillates around an actual frequency, as shown in FIG. 9. To remove the influence of such oscillation, the averaging process is performed. The accuracy of the frequency measured improves in accordance with the length of time of the averaging process. However, the averaging process of the frequency calculated during one period of the reference wave, e.g., in twelve samplings, is performed for the reasons of the measuring time, etc.

$$f_{ave}(k) = \frac{1}{12}\sum_{i=1}^{12} f(k-12+i) \quad \text{[Expression (11)]}$$

In step 8, it is determined whether the frequency measurement of the electric power system is to be ended. When the measurement is further continued, a return to the step 1 is performed.

Figure 10:
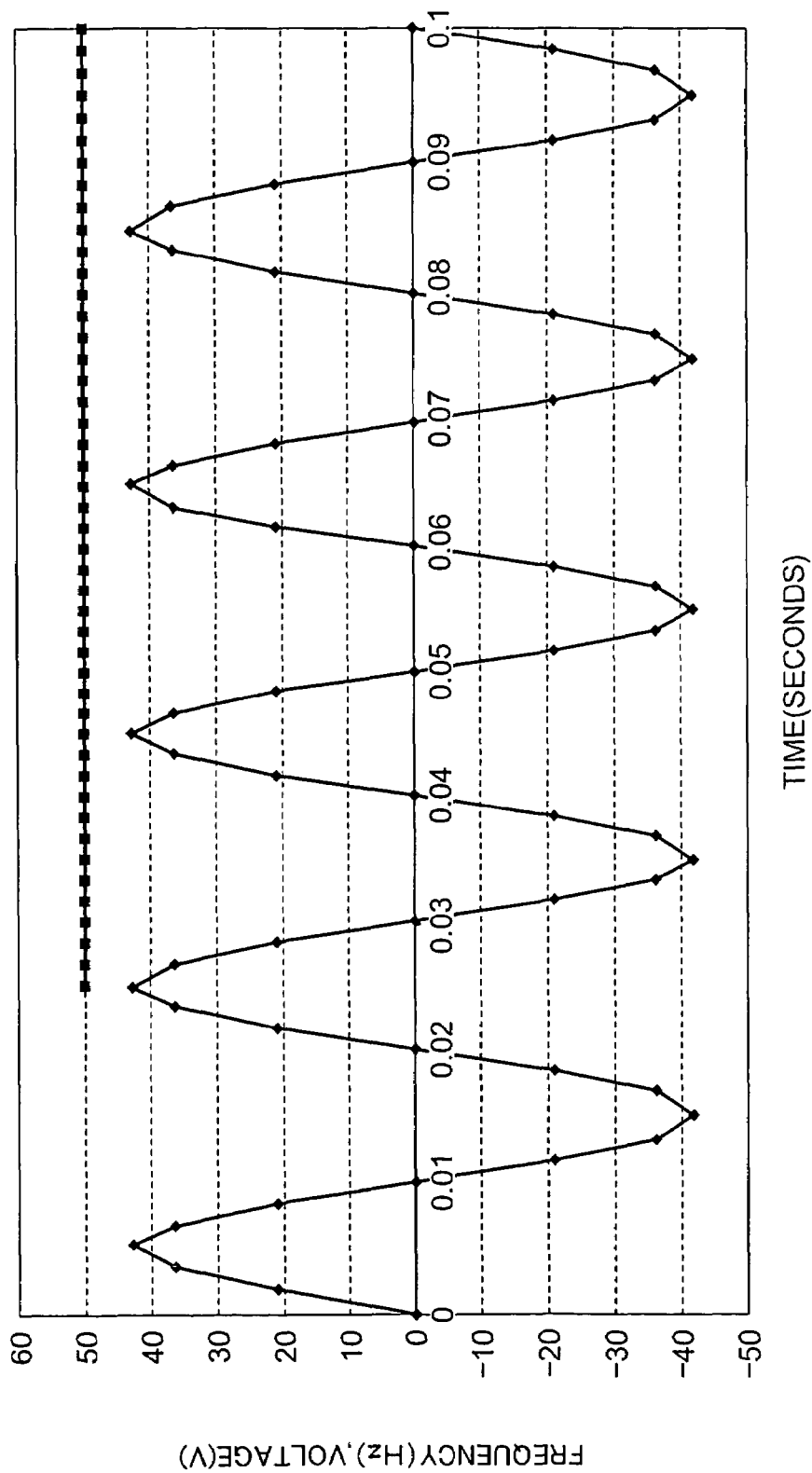
FIG. 10 shows the frequency measurement result of an electric power system having a frequency of 50 Hz (the frequency of the reference wave being 50 Hz).
Figure 11:
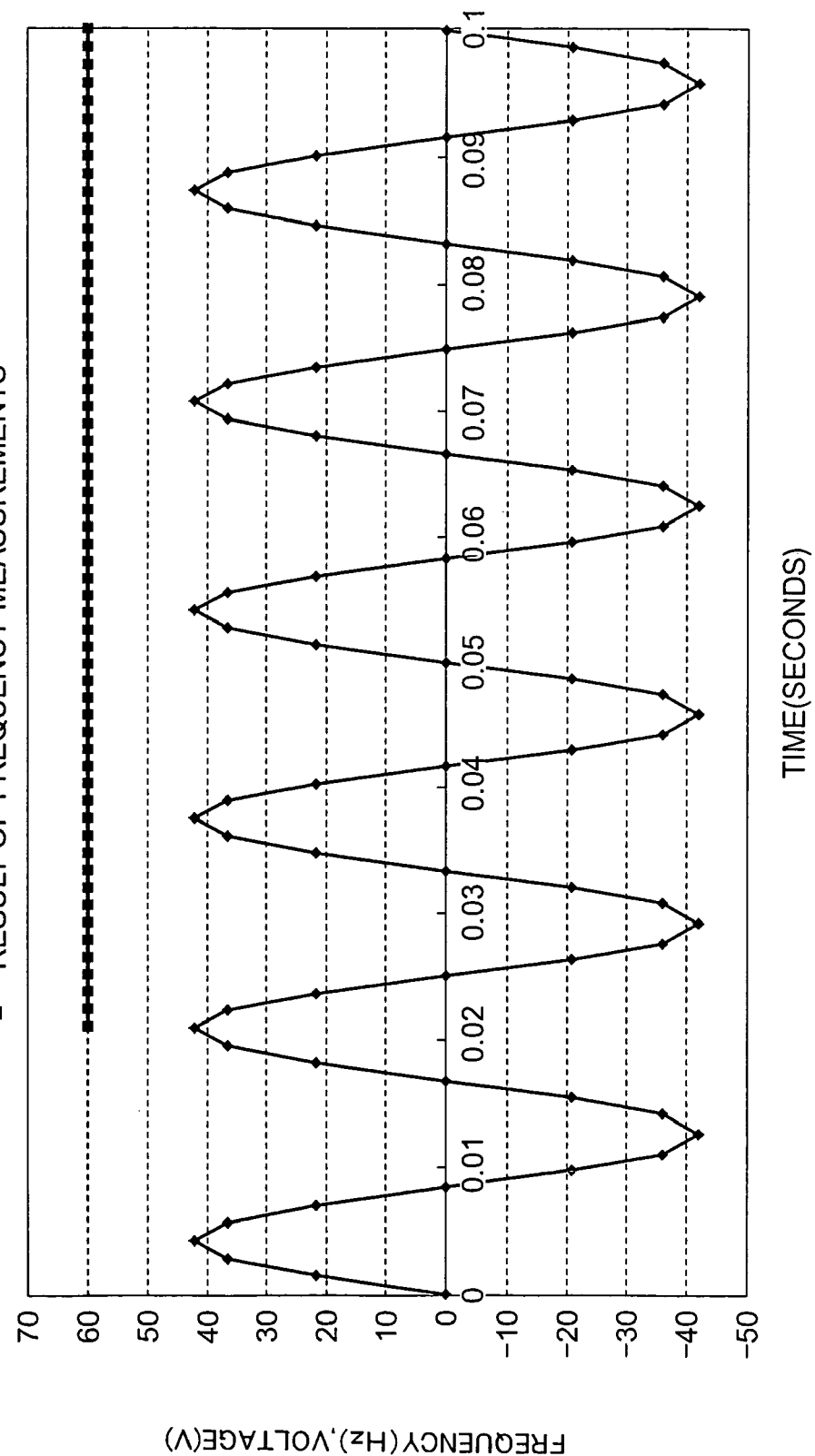
FIG. 11 shows the frequency measurement result of an electric power system having a frequency of 60 Hz (the frequency of the reference wave being 60 Hz).
Figure 12:
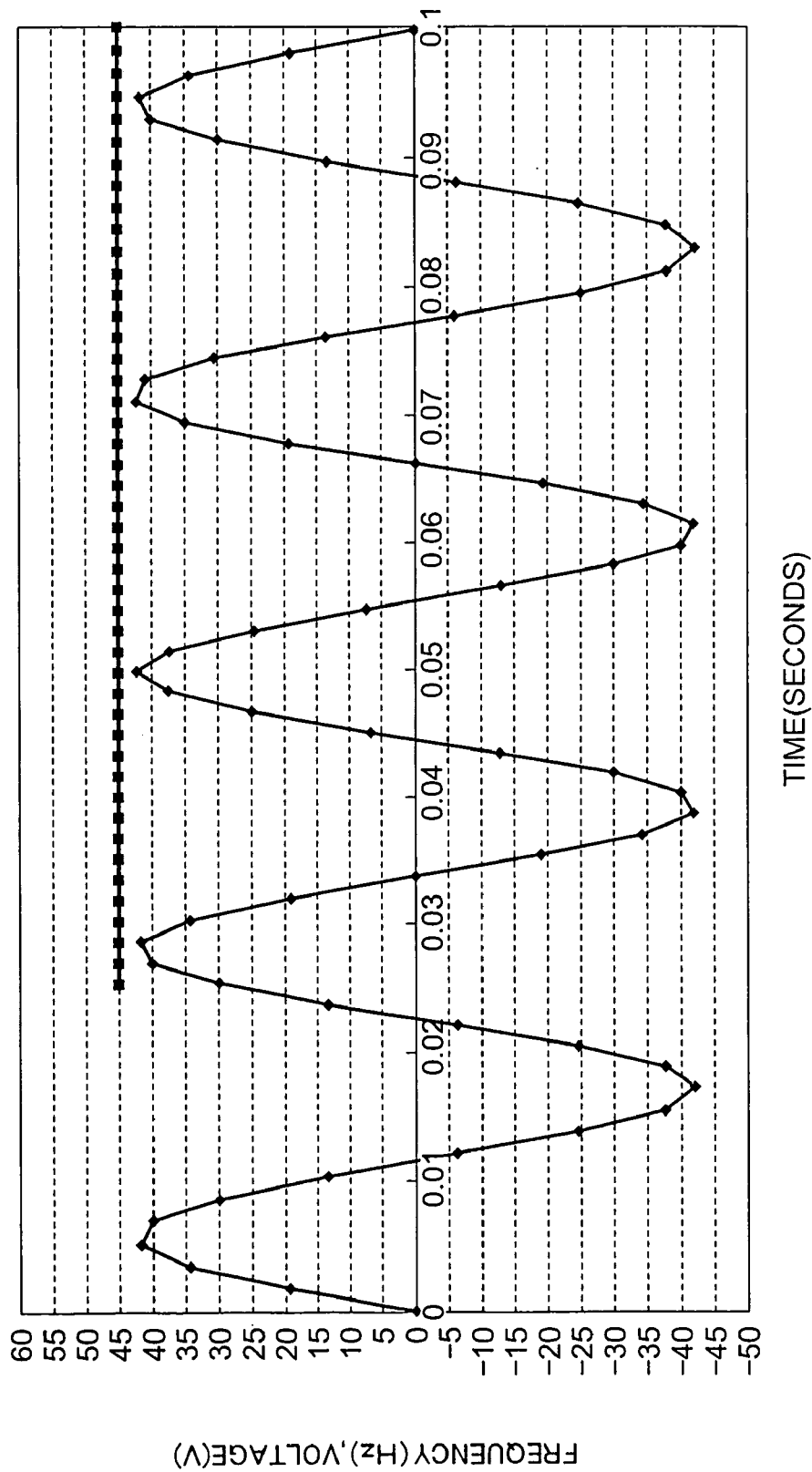
FIG. 12 shows the frequency measurement result of an electric power system having a frequency of 45 Hz (the frequency of the reference wave being 50 Hz).
Figure 13:
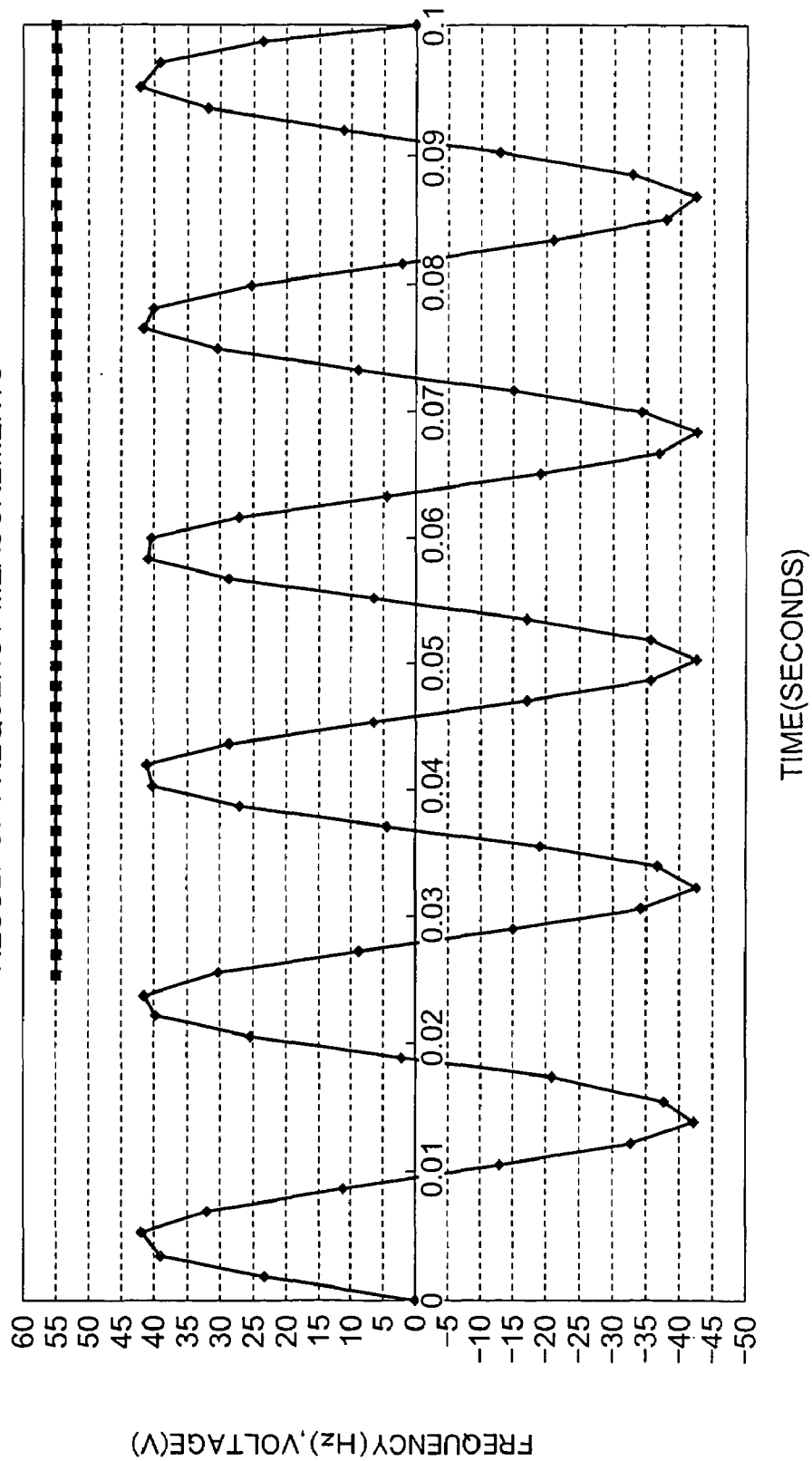
FIG. 13 shows the frequency measurement result of an electric power system having a frequency of 55 Hz (the frequency of the reference wave being 50 Hz).
Figure 14:
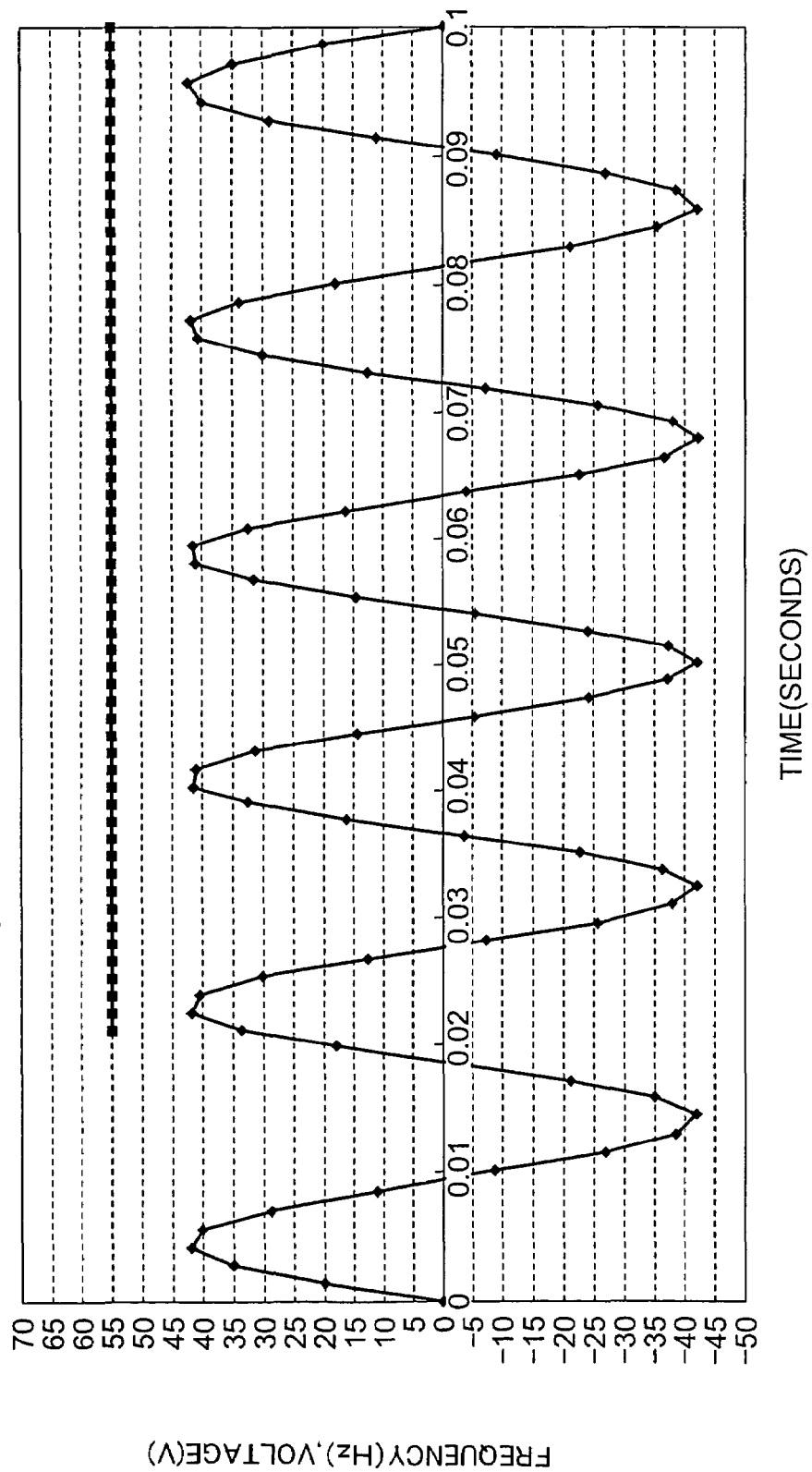
FIG. 14 shows the frequency measurement result of an electric power system having a frequency of 55 Hz (the frequency of the reference wave being 60 Hz).
Figure 15:
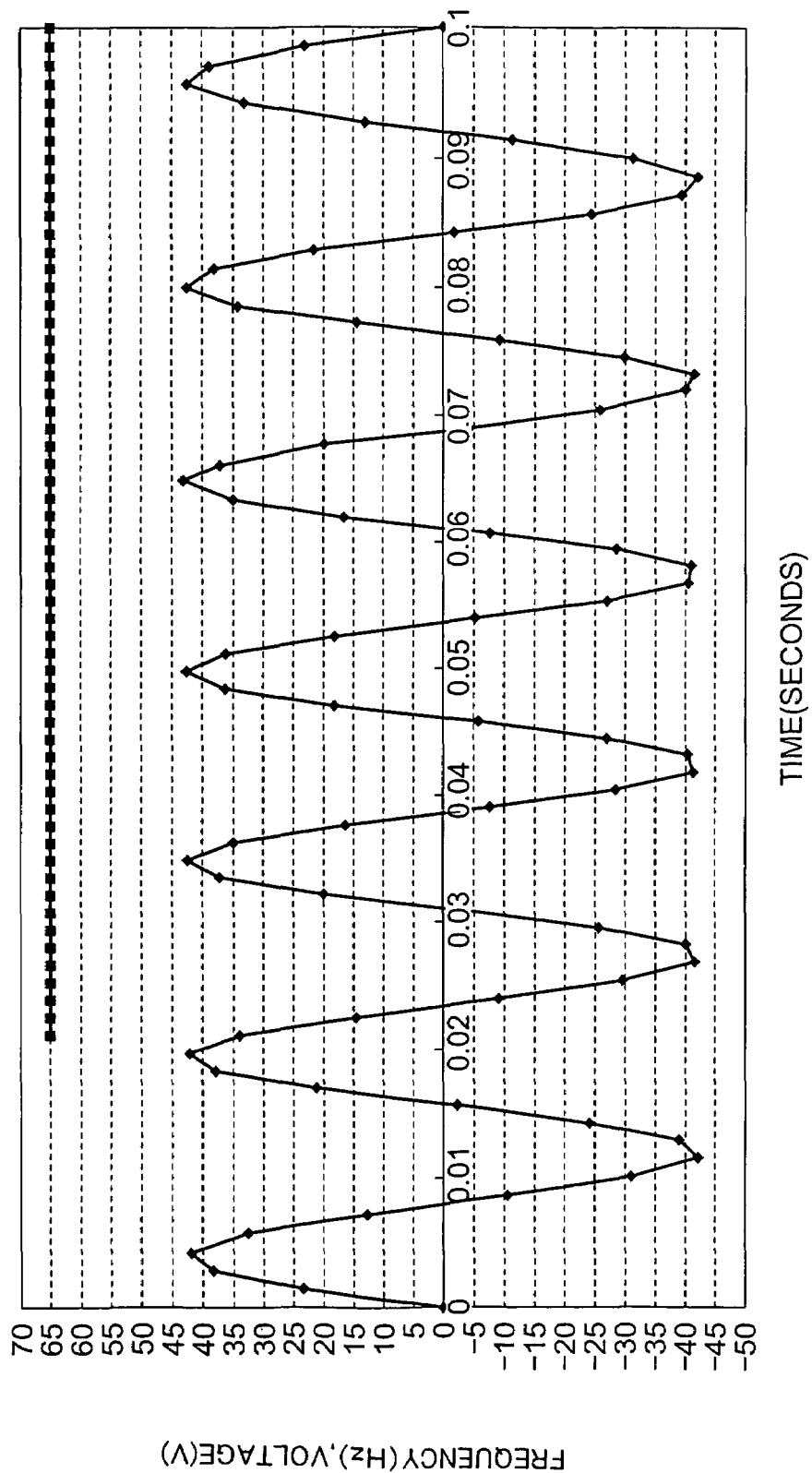
FIG. 15 shows the frequency measurement result of an electric power system having a frequency of 65 Hz (the frequency of the reference wave being 60 Hz).

The results in which the frequencies of electric power systems are obtained by using such a frequency measuring device are shown in FIG. 10 through FIG. 15. FIG. 10 and FIG. 11 respectively show the measurement results when with respect to the frequencies of the reference wave being 50 Hz and 60 Hz, respectively, the frequencies of an object to be measured are similarly 50 Hz and 60 Hz, respectively. As can be seen from these results, the measurements without errors were obtained when the frequencies of the reference wave were close to the frequencies of the object to be measured. On the other hand, it will be understood from FIG. 12 through FIG. 15 that a maximum error of 0.5% was generated in the voltage waveforms when the frequencies of the object to be measured were 45 Hz, 55 Hz and 65 Hz, respectively, which did not coincide with the frequencies of the reference wave. Although the actual frequency of an electric power system varies around a reference frequency, the frequency measuring device of the present invention can measure the stable frequency of the electric power system with high accuracy.

In addition, though the step size Δt for calculation is assumed to be a reference wave rotational electrical angle of 30 degrees, the smaller the calculation step size Δt upon actual measurement, the higher becomes the accuracy in the measurement. FIG. 16 and FIG. 17 show the relations among the reference wave, step size Δt (second), and the number of cords included within one period of the reference wave when the frequencies of the reference wave are 50 Hz and 60 Hz, respectively.

Such a frequency measuring device for an electric power system calculates a voltage vector by using the voltages measured at the timings which are obtained by equally dividing one period of the reference wave by 4N, so that it obtains the frequency of the electric power system by comparison between the rotational phase angle of the voltage vector and the rotational phase angle of the reference wave. As a result, the frequency of the electric power system can be measured in a short time, i.e., in one period of the electric power system.

In addition, in one aspect of the invention, by obtaining the running average of the voltage root-mean-square values, the frequency of the object to be measured can be accurately measured even if the frequency of the reference wave and the frequency of the object to be measured are different from each other.

Moreover, in another aspect of the invention, by obtaining the running average of the frequency, the frequency of the object to be measured can be more accurately measured even if the frequency of the reference wave and the frequency of the object to be measured are different from each other.

Since in the present invention the voltage is represented by a voltage vector rotating on the complex plane, the present invention is different from the conventional alternating current theory in which the steady state of the voltage is represented by a stationary vector (phasor).

Embodiment 2.

Figure 18:
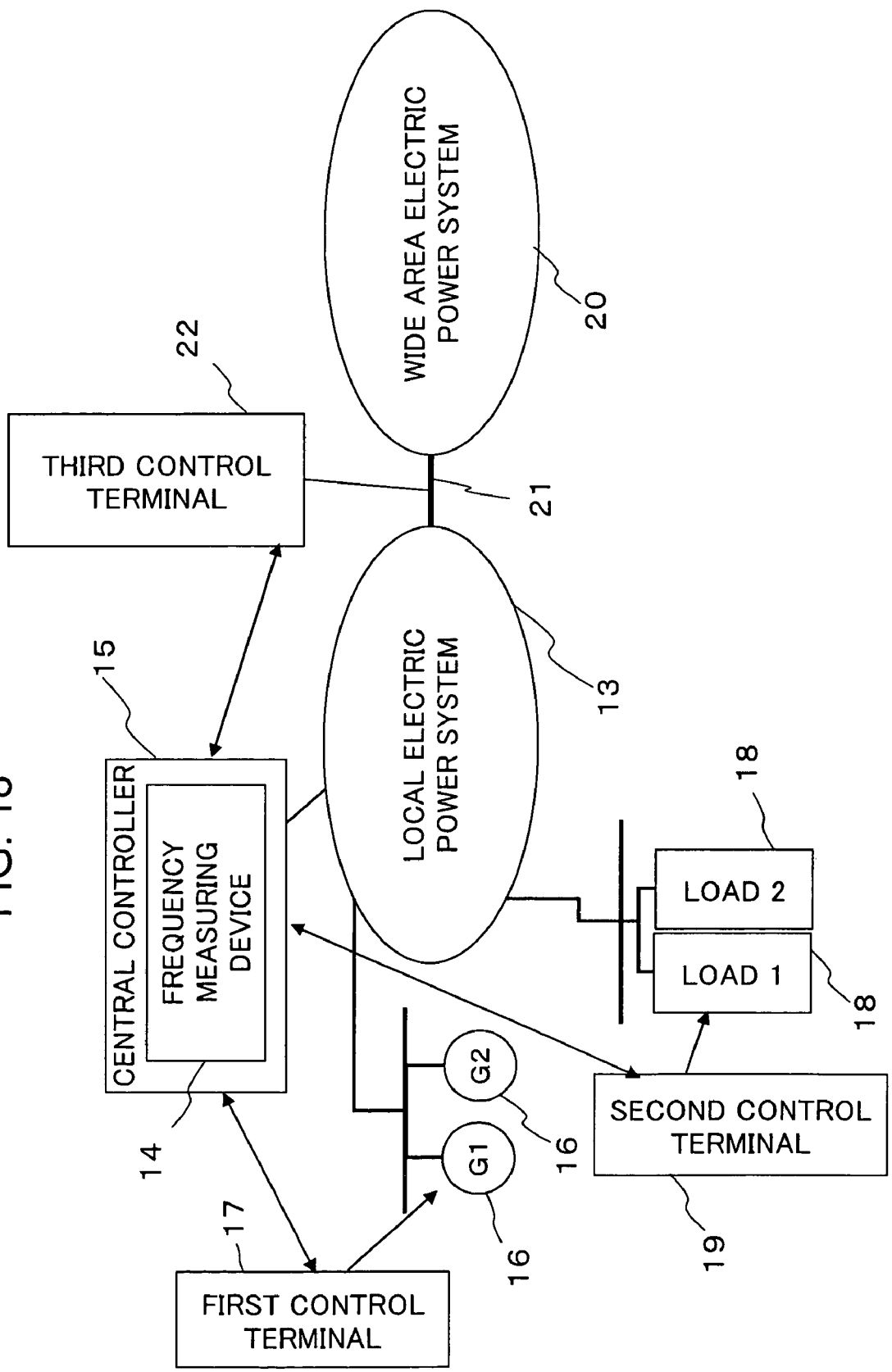
FIG. 18 is a block diagram of a power system frequency stabilization control apparatus using a frequency measuring device according to a second embodiment of the present invention.

FIG. 18 is a block diagram of a power system frequency stabilization control apparatus provided with a power system frequency measuring device according to a second embodiment of the present invention.

The power system frequency stabilization control apparatus includes a central controller 15 for controlling a local electric power system 13 and having a frequency measuring device 14 for measuring the frequency of a local electric power system 13, a first control terminal 17 for controlling generators 16 connected with the local electric power system 13, a second control terminal 19 for controlling loads 18 connected with the local electric power system 13, and a third control terminal 22 for controlling an interconnection line 21 interconnecting between a wide area electric power system 20 and the local electric power system 13.

The operation of this power system frequency stabilization control apparatus will be described below. The frequency measuring device 14 included in the central controller 15 is similar to the one shown in FIG. 1, and hence its explanation is omitted.

When the interconnection line 21 between the wide area electric power system 20 and the local electric power system 13 is interrupted, the third control terminal 22 transmits such an interruption of the interconnection line 21 to the central controller 15. At this time, the central controller 15 measures the frequency of the local electric power system 13 by means of the frequency measuring device 14. When the frequency of the local electric power system 13 rises due to the interruption of the interconnection line 21, the central controller 15 sends a generator trip command to the first control terminal 17, whereby the first control terminal 17 executes a generator trip. In addition, when the frequency of the local electric power system 13 descends, the central controller 15 sends a load trip command to the second control terminal 19, whereby the second control terminal 19 executes a load trip.

Even if the interconnection line 21 is interrupted to leave the local electric power system 13 alone or separated from the wide area electric power system 20, such a frequency measuring device 14 can measure a change in the frequency of the local electric power system 13 at the stage of a small change thereof. Therefore, the generator or load can be tripped at a stage before the balance in the local system is not collapsed to a substantial extent.

Moreover, even if harmonic noise is large as in the local electric power system, it is possible to accurately measure the frequency thereof, whereby the generator or load can be tripped in an appropriate manner.

Embodiment 3.

Figure 19:
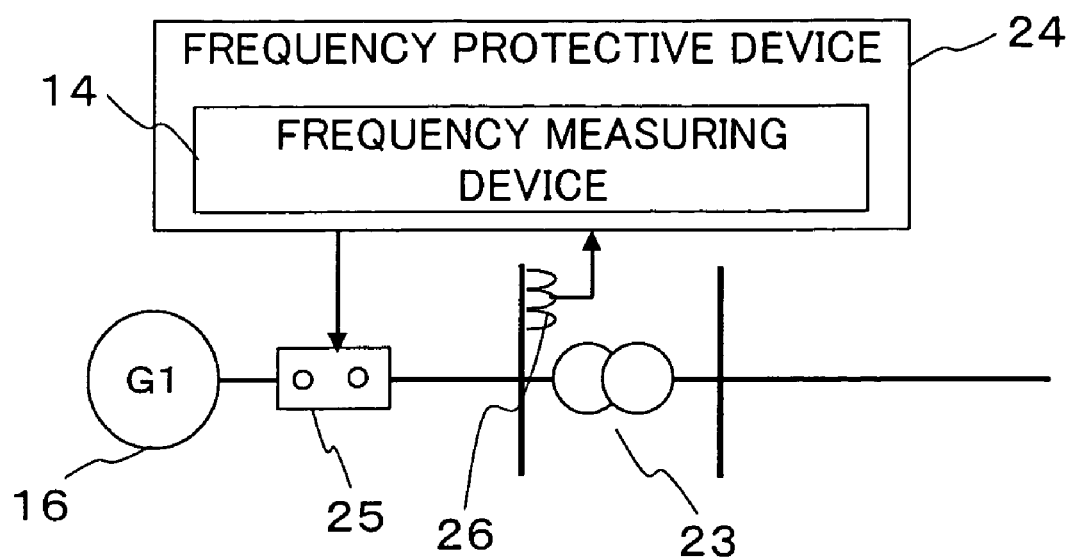
FIG. 19 is a block diagram of a generator frequency protective apparatus using a frequency measuring device according to a third embodiment of the present invention.

FIG. 19 is a block diagram of a generator frequency protective apparatus provided with a frequency measuring device according to a third embodiment of the present invention.

The generator frequency protective apparatus includes a frequency protective device 24 for controlling a generator 16 and having a frequency measuring device 14 for measuring the frequency of a primary side of a step-up transformer 23 connected with an electric power system, and a circuit switchgear 25 for connecting the generator 16 and a primary winding of the step-up transformer 23.

The generator frequency protective apparatus measures the frequency of the primary winding of the step-up transformer 23 by means of a voltage transformer 26, and interrupts the circuit switchgear 25 at an exit of the generator 16 thereby to stop the generator 16 when the measured frequency of the step-up transformer primary winding exceeds a prescribed threshold (e.g., 52 Hz).

Since frequency measuring device 14 can quickly and accurately measure the frequency of generators or other electric power systems, it is possible to coordinate adjustment of the frequency threshold value set between generators and other electric power systems.

Embodiment 4.

FIG. 20 is a block diagram of a power distribution system dispersed power source individual operation preventive apparatus used for dispersed power sources provided with frequency measuring devices according to a fourth embodiment of the present invention.

In order to systematically interconnect dispersed power sources with each other, it is necessary to provide a power distribution system dispersed power source individual operation preventive apparatus that can detect individual operations of the dispersed power sources, and separate the thus detected individually operating ones thereof from the power distribution system when a part of the power distribution system including associated dispersed power sources is systematically separated from the rest of the power distribution system.

The distribution system dispersed power source individual operation preventive apparatus includes two system side control terminals 28 each having a frequency measuring device 14 for measuring the frequency of a secondary side of a corresponding distribution transformer 27, a dispersed power source side control terminal 30 for controlling a generator 16 systematically interconnected with a distribution system 29, and having a frequency measuring device 14 for measuring the frequency of the generator 16, and a central controller 15 for monitoring the frequencies of the system side and the dispersed power source side so as to control the respective control terminals 28, 30.

The control terminals 28 for controlling the secondary sides of the distribution transformers 27 and the dispersed power source side control terminal 30 constantly measure the frequencies of the distribution transformers 27 and the generator 16, respectively, and transmit them to the central controller 15. When the difference between the frequency of the secondary side of either of the distribution transformers 27 and the frequency of the generator 16 in the form of a dispersed power source exceeds a prescribed threshold (e.g., 0.1 Hz), the central controller 15 determines that an individual operation of the generator 16 in the form of the dispersed power source has taken place, and sends a dispersed power source separation command to the dispersed power source side control terminal 30. The dispersed power source side control terminal 30 executes the separation command to trip the circuit switchgear 25.

Thus, such a distribution system dispersed power source individual operation preventive apparatus can promptly separate the generator 16 from the power distribution system 29, so that the safety recovery of the power distribution system is ensured.

While the invention has been described in terms of preferred embodiments, those skilled in the art will recognize that the invention can be practiced with modifications within the spirit and scope of the appended claims.

What is claimed is:

1. A frequency measuring apparatus comprising:
   a voltage measuring part for measuring the voltage of an electric power system at timings which are obtained by equally dividing one period of a reference wave by 4N (N being a positive integer);
   a chord length calculation part for calculating, at each of (4N+1) timings, voltage vectors directed to points represented by complex numbers on a complex plane, each complex number consisting of a real part, which is one of the voltages measured at a first timing comprising any of the (4N+1) timings, and an imaginary part, which is a voltage measured at a second timing delayed by 90 electrical degrees from the first timing, the chord length calculation part further calculating, at each of the (4N+1) timings, the length of a chord connecting a tip end of one of the voltage vectors calculated at a third timing, comprising any of the (4N+1) timings, to a tip end of another of the voltage vectors calculated at the last timing before the third timing;
   a voltage root-mean-square value calculation part for calculating, at a fourth timing comprising each of the (4N+1) timings, a voltage root-mean-square value from those of the voltages which are measured at past 4N timings, from the fourth timing and at the fourth timing;
   a rotational phase angle calculation part for summing, at a fifth timing, comprising each of the (4N+1) timings, those of the chord lengths which have been obtained at past 4N timings from the fifth timing and at the fifth timing, and calculating, based on a sum of the chord lengths and the voltage root-mean-square value, a phase angle between one of the voltage vectors calculated at a sixth timing comprising any of the timings and another voltage vector calculated at a timing preceding the sixth timing by one period of said reference wave; and
   a frequency calculation part for calculating the frequency of the electric power system from the phase angle thus calculated.

2. The frequency measuring device as set forth in claim 1, further comprising a root-mean-square value voltage averaging part for averaging, at each of the (4N+1) timings, the calculated voltage root-mean-square value and at least one of those voltage root-mean-square values which have been calculated before the calculation of the voltage root-mean-square value, to provide a voltage root-mean-square value.

3. The frequency measuring device as set forth in claim 1, further comprising a frequency averaging part for averaging, at each of the (4N+1) timings, the calculated frequency and at least one of frequencies of the electric power system which have been calculated before the calculation of the frequency, to provide the frequency of the electric power system.

4. The frequency measuring device as set forth in claim 1, including one of a power system frequency stabilization control apparatus, a generator frequency protective apparatus, and a power distribution system dispersed power source individual operation preventive apparatus.

* * * * *